United States Patent [19]

Saeki et al.

[11] Patent Number: 4,941,224
[45] Date of Patent: Jul. 17, 1990

[54] ELECTROSTATIC DUST COLLECTOR FOR USE IN VACUUM SYSTEM

[75] Inventors: Hiroshi Saeki, Tsukuba; Junji Ikeda, Ikoma; Hajime Ishimaru, Tsukuba, all of Japan

[73] Assignees: Matsushita Electric Industrial Co., Ltd., Osaka; Hajima Ishimaru, Tsukuba, both of Japan

[21] Appl. No.: 383,150

[22] Filed: Jul. 19, 1989

[30] Foreign Application Priority Data

Aug. 1, 1988 [JP] Japan ................... 63-192535

[51] Int. Cl.⁵ .................................................. B08B 6/00
[52] U.S. Cl. ...................................... 15/1.5 R; 55/150; 55/149; 55/155
[58] Field of Search ................... 55/150, 149, 154, 155, 55/138; 15/1.5 R

[56] References Cited

U.S. PATENT DOCUMENTS 4,071,334 1/1978 Kolb et al. ............................ 55/150
4,744,833 5/1988 Cooper et al. ...................... 15/1.5 R

OTHER PUBLICATIONS

Sachar, K. S., Electrostatic Cleaning of Surfaces, IBM Technical Disclosure Bulletin, vol. 18, No. 5, Oct. 1975, pp. 1619–1621.

*Primary Examiner*—Bernard Nozick
*Attorney, Agent, or Firm*—Wenderoth, Lind & Ponack

[57] ABSTRACT

An electrostatic dust collector including a wall enclosing a vacuum chamber in which a target face to be subjected to dust removal is provided, an electron beam emitting device for emitting electron beams to dust on the target face so as to charge the dust negatively, a dielectric member which is provided in the vacuum chamber and has a collecting face confronting the target face and a member for imparting positive potential to the collecting face such that the dust charged negatively is attracted to the collecting face.

2 Claims, 1 Drawing Sheet

ELECTROSTATIC DUST COLLECTOR FOR USE IN VACUUM SYSTEM

BACKGROUND OF THE INVENTION

The present invention relates to an electrostatic dust collector for use in a vacuum system and suitable for removing dust in a vacuum chamber having high-voltage electrodes, for example, an apparatus for producing electronic device such as semiconductors by forming thin films through utilization of vacuum or a high-frequency accelerating chamber of a particle accelerator.

Conventionally, electrostatic dust collectors for use in atmosphere have been widely used in various technical fields. However, no apparatus for removing dust in vacuum environment has been proposed. Thus, in the case where gas, etc. are fed into vacuum environment, a filter has been at most employed so as to minimize entry of dust into vacuum environment. In this case, the filter can achieve a rather excellent dust collecting effect. However, the filter cannot remove dust generated from an exhaust pump operated under vacuum environment, such as an ion pump, a titanium sublimation pump, etc. nor thin-layered dust adhering to a wall of a vacuum chamber. Thus, wafers of the semiconductors, an apparatus for producing the wafers, etc. are soiled with dust generated in vacuum environment. Hence, yield of the wafers, etc. drops and the exhaust pump also deteriorates. Meanwhile, dust is collected in the high-frequency accelerating chamber of the particle accelerator. Thus, if dust adheres to high-pressure components of the particle accelerator, abnormal electric discharge happens, thereby resulting in insufficient acceleration of particles.

Meanwhile, in the known electrostatic dust collectors for use in atmosphere, air or gas is passed between collecting electrodes such that dust in air or gas is caused to adhere to the collecting electrodes. Hence, the known electrostatic dust collectors cannot be used for removing dust adhering to the wall of the vacuum chamber or the wafers. In addition, even if dust is caused to adhere to the collecting electrodes, dust drops therefrom when electric charge of dust vanishes, so that cleaning in vacuum environment cannot be performed by the known electrostatic dust collectors.

SUMMARY OF THE INVENTION

Accordingly, an essential object of the present invention is to provide an electrostatic dust collector which is capable of cleaning by removing dust adhering to, especially, a wall of a vacuum chamber or wafers so as to prevent soiling of the wafers or an apparatus for producing the wafers such that not only yield of the wafers can be improved but also deterioration of an exhaust pump can be prevented and which is capable of preventing abnormal electric discharge of high-pressure components of a particle accelerator so as to prevent degradation of accelerating performance of the particle accelerator.

Another important object of the present invention is to provide an electrostatic dust collector in which dust can be removed through its continuous adherence and can be easily taken out of the wall of the vacuum chamber.

In order to accomplish these objects of the present invention, an electrostatic dust collector according to a first embodiment of the present invention comprises: a wall enclosing a vacuum chamber in which a target face to be subjected to dust removal is provided; an electron beam emitting means for emitting electron beams to dust on said target face so as to charge the dust negatively; a dielectric member which is provided in the vacuum chamber and has a collecting face confronting said target face; and means for imparting positive potential to said collecting face such that the dust charged negatively is attracted to said collecting face.

Meanwhile, in an electrostatic dust collector according to a second embodiment of the present invention, said dielectric member is formed into a tapelike shape, said electrostatic dust collector further comprising: a cassette which accommodates said dielectric member and includes first and second hubs and an electrode for imparting positive potential to said collecting face; said dielectric member being trained over said first and second hubs so as to be fed from said first hub to said second hub; said electrode being disposed at a location confronting, in the course of a path of feed of said dielectric member from said first hub to said second hub, said target face and a drive means for driving said second hub so as to feed said dielectric member.

By the above described arrangement of the electrostatic dust collector of the present invention, electron beams are emitted to the target face in the wall of the vacuum chamber by the electron beam emitting means so as to charge the dust on the target face negatively, while the collecting face of the dielectric member confronting the target face is set to positive potential by the voltage impressing means, so that the negatively charged dust can be attracted to the collecting face having positive potential.

Meanwhile, since the dielectric member is formed into a tapelike shape and is accommodated in the cassette so as to be fed from the first hub to the second hub and positive potential is imparted to the collecting face confronting the target face, the negatively charged dust can be attracted to the collecting face having positive potential.

BRIEF DESCRIPTION OF THE DRAWINGS

These objects and features of the present invention will become apparent from the following description taken in conjunction with the preferred embodiments thereof with reference to the accompanying drawings, in which.

DETAILED DESCRIPTION OF THE INVENTION

Figure 1:
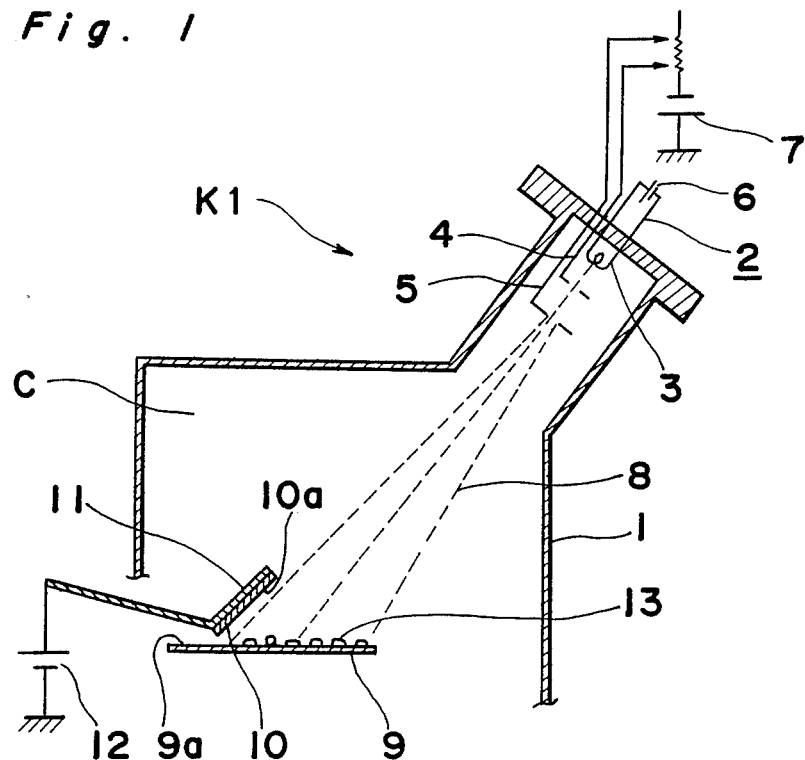
FIG. 1 is a fragmentary sectional view of an electrostatic dust collector according to a first embodiment of the present invention.

Referring now to the drawings, there is shown in FIG. 1, an electrostatic dust collector K1 for use in a vacuum system according to a first embodiment of the present invention The electrostatic dust collector K1 includes a wall 1 of a vacuum chamber C and an electron gun 2 mounted on the wall 1. The electron gun 2 has a filament 3 and a plurality of, for example, two lead-out electrodes 4 and 5 such that the filament 3 and the lead-out electrodes 4 and 5 are hermetically fitted through the wall 1. The electrostatic dust collector K1 further includes a power source 6 for supplying power to the filament 3 and a high-voltage power source 7 for supplying high-voltage power to the lead-out electrodes 4 and 5. The electron gun 2 emits electron beam shower 8 to a target face 9a of a substrate 9 such as a wafer provided in the vacuum chamber C inside the wall 1, which target face 9a is subjected to dust removal. A dielectric member 10 is provided inside the wall 1 and is made of material having high dielectric constant, for example, epoxy glass, etc. In order not to intercept the electron beam shower 8 proceeding to the target face 9a of the substrate 9, the dielectric member 10 is so provided as to obliquely confront the target face 9a. An electrode 11 made of copper is provided on the rear face of the dielectric member 10. One end of the electrode 11 is hermetically fitted through the wall 1. A high-voltage power source 12 is provided for supplying high-voltage power to the electrode 11.

Hereinbelow, operation of the electrostatic dust collector K1 of the above described arrangement is described Initially, the electron gun 2 is actuated by the power sources 6 and 7 so as to emit the electron beam shower 8 to the target face 9a of the substrate 9. Dust 13 on the target face 9a is charged negatively by the electron beam shower 8. On the other hand, when positive electric potential is imparted to the electrode 11 by the power source 12, one face of the dielectric member 10 remote from the electrode 11, namely a collecting face 10a of the dielectric member 10, which confronts the target face 9a of the substrate 9, has positive potential. Thus, the dust 13 charged negatively is attracted to the dielectric member 10 having positive potential. At this time, even if the dielectric member 10 has positive potential, electric current does not flow through the dielectric member 10 in contrast with an electrode made of copper, etc. Accordingly, the dust 13 adhering to the dielectric member 10 is not charged positively and therefore, is held in a state of adhering to the dielectric member 10. Thus, the target face 9a of the substrate 9, which is subjected to dust removal, can be cleaned.

Figure 2:
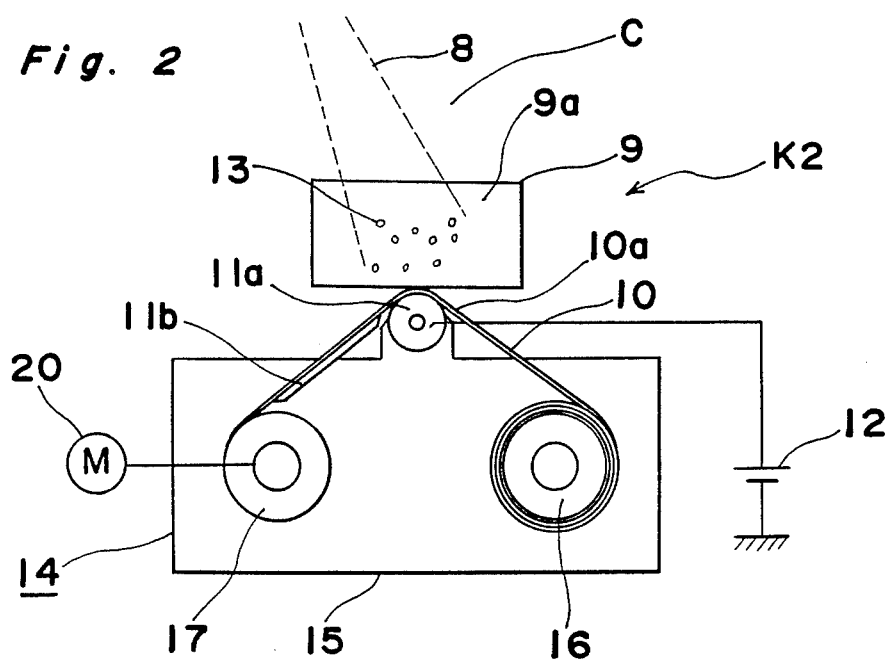
FIG. 2 is a schematic view of an electrostatic dust collector according to a second embodiment of the present invention.

Referring now to FIG. 2, there is shown an electrostatic dust collector K2 for use in a vacuum system according to a second embodiment of the present invention. In the electrostatic dust collector K2, the dielectric member 10 is formed into a tapelike shape and is so accommodated in a cassette 14 as to be wound. Namely, in a shell 15, the tapelike dielectric member 10 is wound around a hub 16 so as to be fed from the hub 16 to a hub 17. During feed of the dielectric member 10 from the hub 16 to the hub 17, the dielectric member 10 is guided by a rotatable cylindrical electrode 11a and a platelike electrode 11b. At an outer periphery of the electrode 11a, the dielectric member 10 obliquely confronts the target face 9a of the substrate 9. The hub 17 is driven by a motor 20 and thus, the tapelike dielectric member 10 drawn out of the hub 16 is fed along the electrodes 11a and 11b so as to be wound around the hub 17. Since other constructions of the electrostatic dust collector K2 are similar to those of the electrostatic dust collector K1, description thereof is abbreviated for the sake of brevity.

Operation of the electrostatic dust collector K2 is described, hereinbelow. In the same manner as in the electrostatic dust collector K1, the electron beam shower 8 is initially emitted to the target face 9a of the substrate 9 from the electron gun 2. Meanwhile, positive potential is imparted to the electrodes 11a and 11b by the power source 12 such that positive potential is imparted to the collecting face 10a confronting the target face 9a of the substrate 9. Thus, the dust 13 charged negatively is attracted by the dielectric member 10 having positive potential so as to be held in a state of adhering to the dielectric member 10. When the dielectric member 10 is partially soiled with the dust 13 adhering thereto, the hub 17 is rotated by the motor 20 so as to slightly wind the tapelike dielectric member 10 therearound such that a new clean portion of the collecting face 10a confronts the target face 9a of the substrate 9. Hence, clean portions of the collecting face 10a of the dielectric member 10 can be continuously fed. When the dielectric member 10 has been soiled substantially over its overall length through adherence of the dust 13 thereto, the dielectric member 10 together with the cassette 14 can be taken out of the wall 1 so as to be discarded.

Meanwhile, when the electron gun 2 and the dielectric member 10 are so provided as to confront the inner face of the wall 1, dust on the inner face of the wall 1 can be removed. It can also be so arranged that the electron gun 2 is angularly variable such that the dielectric member 10 is displaced by a manipulator.

As is clear form the foregoing description, in the electrostatic dust collector according to the first embodiment of the present invention, electron beams are emitted to the target face in the wall of the vacuum chamber by the electron beam emitting means so as to charge the dust on the target face negatively, while positive potential is imparted to the collecting face of the dielectric member confronting the target face. Thus, the negatively charged dust is attracted to the collecting face having positive potential such that cleaning is performed. Accordingly, in accordance with the present invention, since soiling of wafers, an apparatus for producing the wafers, etc. can be prevented, yield of the wafers, etc. can be improved. Furthermore, in accordance with the present invention, deterioration of an exhaust pump can be prevented and accelerating performance of a particle accelerator can be improved by preventing abnormal electric discharge of high-pressure components of the particle accelerator.

Meanwhile, in the electrostatic dust collector according to the second embodiment of the present invention, the dielectric member formed into a tapelike shape is accommodated in the cassette so as to be fed from one hub to the other hub such that the collecting face of the dielectric member confronting the target face is set to positive potential. Therefore, in accordance with the present invention, the negatively charged dust is attracted to the collecting face having positive potential such that cleaning is performed in the same manner as in the first embodiment. Accordingly, dust can be continuously attracted to the dielectric member so as to be removed and can be taken out of the wall of the vacuum chamber easily.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. An electrostatic dust collector comprising:
   a wall enclosing a vacuum chamber in which a target face to be subjected to dust removal is provided;

an electron beam emitting means for emitting electron beams to dust on said target face so as to charge the dust negatively;

a dielectric member which is provided in the vacuum chamber and has a collecting face confronting said target face; and means for imparting positive potential to said collecting face such that the dust charged negatively is attracted to said collecting face.

2. An electrostatic dust collector as claimed in claim 1, wherein said dielectric member is formed into a tape-like shape, said electrostatic dust collector further comprising:

a cassette which accommodates said dielectric member and includes first and second hubs and an electrode for imparting positive potential to said collecting face;

said dielectric member being trained over said first and second hubs so as to be fed from said first hub to said second hub;

said electrode being disposed at a location confronting, in the course of a path of feed of said dielectric member from said first hub to said second hub, said target face; and a drive means for driving said second hub so as to feed said dielectric member.

* * * * *

UNITED STATES PATENT AND TRADEMARK OFFICE
CERTIFICATE OF CORRECTION

PATENT NO. : 4,941,224

DATED : July 17, 1990

INVENTOR(S) : Hiroshi SAEKI, Junji IKEDA and Hajime ISHIMARU

It is certified that error appears in the above-identified patent and that said Letters Patent is hereby corrected as shown below:

On the title page, item [73] Assignee:

Please change the co-assignee's name from "Hajima ISHIMARU"

to -- Hajime ISHIMARU --.

Signed and Sealed this

Twentieth Day of October, 1992

*Attest:*

DOUGLAS B. COMER

*Attesting Officer*      *Acting Commissioner of Patents and Trademarks*